United States Patent [19]

Isaacman et al.

[11] Patent Number: 4,794,622
[45] Date of Patent: Dec. 27, 1988

[54] LOW POWER TRANSMITTER FREQUENCY STABILIZATION

[75] Inventors: Marvin Isaacman, Los Angeles; David C. Andrus, Carlsbad, both of Calif.

[73] Assignee: Linear Corporation, Carlsbad, Calif.

[21] Appl. No.: 196,882

[22] Filed: May 19, 1988

Related U.S. Application Data

[63] Continuation of Ser. No. 740,526, Jun. 3, 1985, abandoned.

[51] Int. Cl.$^4$ .................... H03K 7/08; H04B 1/034
[52] U.S. Cl. .................... 375/71; 455/119; 455/125; 375/22
[58] Field of Search ............. 331/107 A; 375/22, 23, 375/71; 455/95, 100, 119, 125; 340/696

[56] References Cited

U.S. PATENT DOCUMENTS

| | | | |
|---|---|---|---|
| Re. 29,525 | 1/1978 | Willmott | 375/23 |
| 3,868,595 | 2/1975 | Capps, Jr. et al. | 331/107 A |
| 4,004,228 | 1/1977 | Mullett | 455/95 |
| 4,085,388 | 1/1978 | Gilden et al. | 331/107 A |
| 4,231,031 | 10/1980 | Crowther et al. | 375/23 |
| 4,249,418 | 2/1981 | Ebata | 331/107 A |
| 4,327,444 | 4/1982 | Court | 455/100 |
| 4,354,166 | 10/1982 | Grudkowski | 331/107 A |

OTHER PUBLICATIONS

"LC Oscillators", *Electronics Designers' Handbook*, Giacoletto, McGraw-Hill, 1977, pp. 16-3 to 16-8.
Woodward et al.; *The Radio Amateur's Handbook*; The American Radio Relay League Inc.; Newington, Ct.; USA; 1981; pp. 6-3 and 6-4.
Fink et al.; *Electronics Engineers' Handbook*; McGraw-Hill Book Company; New York; Second Edition, 1982; pp. 13-27.

Primary Examiner—Benedict V. Safourek
Assistant Examiner—Andrew J. Telesz, Jr.
Attorney, Agent, or Firm—Ladas & Parry

[57] ABSTRACT

An improved miniature hand-held low power transmitter utilizing a surface acoustic wave (SAW) resonator as the control element to establish the carrier frequency of the oscillator. The SAW resonator stabilizes the frequency of the transmitter to within 0.05% of the center frequency of the SAW resonator for the condition of the user's hand enclosing the transmitter. This stability allows the companion receiver to operate at a narrow bandwidth, 0.1% of the center frequency of the SAW resonator, thus reducing the spurious noise received by the receiver. The configuration of the transmitter allows schemes such as pulse position or pulse width modulation to be utilized to encode the transmitted information. The physical size of the SAW resonator allows the transmitter to be mounted within a housing small enough to be enclosed by the user's hand.

9 Claims, 2 Drawing Sheets

LOW POWER TRANSMITTER FREQUENCY STABILIZATION

This is a continuation of co-pending application Ser. No. 740,526 filed June 3, 1985 now abandoned.

BACKGROUND OF THE INVENTION

1. Field of the Invention

This invention relates to the art of transmitting information and, more particularly to an improved low power transmitter arrangement incorporating a surface acoustic wave resonator to stabilize the carrier frequency of a small hand held transmitter.

2. Description of the Prior Art

The modern history of low power, hand held transmitters began shortly after the transistor replaced the bulky, power hungry vacuum tube. The small transmitters are essential for garage door openers, security systems, etc. Some of the overall constraints in the development of this type of transmitter are to produce the device at a low cost and to fit the components into as small a unit as practicable.

The low cost has dictated the use of some means other than a quartz crystal to control and stabilize the frequency of the transmitted signal. The most commonly used method for inexpensively replacing the costly quartz crystal has been to use "lumped" circuit elements in the form of a tank circuit which oscillates around a preselected frequency.

U.S. Pat. No. 4,004,228 describes the use of a Colpitts oscillator with lumped circuit elements and a variable capacitor to establish and control the transmitted frequency. It further shows the mounting of the lumped components within the antenna coil and adjacent a metal shield ground plane to minimize the effects of any stray capacitance adjacent to the transmitter. However, a wide band receiver must still be used as a companion to this transmitter as the effect of hand capacitance of the user's hand engaging the transmitter activation switch can change the transmitted frequency by 5 to 10 percent.

The use of "lumped" circuits consisting of reactive elements to comprise a tank circuit that will oscillate at a preselected frequency requires a number of discrete components with the corresponding cost of each component for both procurement and mounting within the circuit.

The lumped circuit method of frequency specification results in lower cost as compared with the use of a quartz crystal. However, the lumped circuit elements are prone to temperature and humidity drifts as well as shock and vibration damage. Further, as the transmitters are reduced in size, the presence of a hand around the transmitter will exaggerate the hand capacitance effect on the "lumped" elements. This additional capacitance will offset the carrier frequency by an amount that will vary each time the transmitter is used.

The offsetting of the frequency of the transmitter will require the bandwidth of the companion receiver to be expanded in order to insure that the transmitted signal will be detected. Widening the bandwidth will decrease the sensitivity of the receiver and cause the receiver to be susceptible to stray or unauthorized signals as well as decrease the signal to noise ratio exhibited by the receiver.

U.S. Pat. No. 4,327,444 claims to overcome the shift in transmitted frequency with resultant 5 to 10 db loss in signal strength associated with the above referenced and other low power transmitters when a user's hand envelopes the transmitter and hand-capacitance detunes the oscillator. This patent teaches the use of a harmonic relationship between the frequency of oscillation of the lumped circuit components and the tuned frequency of the antenna. However, the transmitter is still subject to the whims of hand-capacitance which is not a constant or repeatable phenomenon and requires the circuit to be detuned by 5% or more.

Thus, the bandwidth of the companion receiver must still be wide to enable the receiver to detect the signal for all values of variable hand capacitance that might influence the transmitted frequency.

Thus, there has long been a need to provide an inexpensive, frequency stabilizing element for low cost, low power, hand held transmitters.

SUMMARY OF THE INVENTION

Accordingly, it is an object of the present invention to provide an inexpensive single element that will impart frequency stability to a UHF oscillator circuit.

It is another object of this invention to provide a sufficient amount of frequency stability to the transmitter that the bandwidth of the companion receiver circuit can be reduced to a figure as low as 0.1%.

Another object of this invention is to provide a frequency stabilization element that is not de-tuned more than 0.05% by the effect of hand capacitance.

Yet another object of the invention is to provide a lightweight frequency control element that is small in size so that the overall transmitter size can be reduced.

These and other objects are accomplished by using a surface acoustic wave (SAW) resonator to control the frequency of oscillation of a low power transmitter. The surface acoustic wave resonator is lightweight, small in size, inexpensive and is offset by only 0.01 to 0.05% due to hand capacitance.

In the present invention, the SAW resonator is coupled to a Colpitts oscillator in a grounded base configuration. If a simple capacitor were substituted in place of the resonator, the Colpitts circuit would oscillate at its natural frequency dictated by the tank circuit attached between the collector and emitter of the transistor. However, the Colpitts oscillator would drift with changes in circuit component values due to temperature and especially in the presence of stray capacitance such as hand capacitance.

The SAW resonator is a web of aluminum fingers formed upon a suitable substrate. The fingers are photoetched on a substrate with a spacing of one-half wavelength between the fingers. Upon the application of an electrical potential, a surface wave is excited that will oscillate at a frequency defined by the spacing of the fingers. This surface oscillation generates a field that provides a low impedance return for the base of the transmitter oscillator transistor.

The Colpitts oscillator is selected as the preferred embodiment over other types of oscillators as stray capacitance does not create spurious resonances as would be the case with a Hartley oscillator. Further, the oscillator tank circuit needs to be low Q so that the SAW resonator can force the frequency yet the oscillator will still oscillate.

If the values of the elements comprising the tank circuit are selected so that the natural frequency of the Colpitts oscillator is near the natural frequency of the resonator, the oscillating field of the SAW resonator will stabilize the Colpitts oscillator within 0.05% of the natural frequency of the SAW resonator whether the transmitter is operating clasped by the hand of the user or in free space.

BRIEF DESCRIPTION OF THE DRAWING

The above and other embodiments of the present invention may be more fully understood from the following detailed description, taken together with the accompanying drawing, wherein similar reference characters refer to similar elements throughout, and in which.

DESCRIPTION OF A PREFERRED EMBODIMENT

Figure 1:
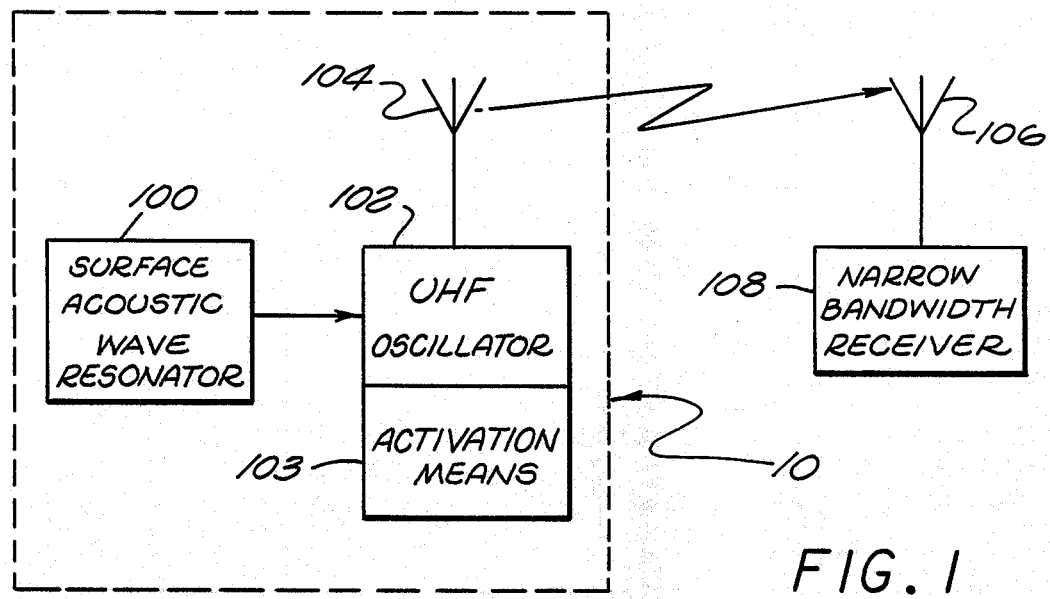
FIG. 1 represents a block diagram of a low power frequency stabilized transmitter with a companion narrow bandwidth receiver.

FIG. 1 shows the basic elements of a low power frequency stabilized transmitter 10. The transmitter 10 may contain an activation means 103 to enable a user to control the broadcast operation of the UHF oscillator 102. The transmitter 10 utilizes a UHF oscillator to generate an RF signal which is coupled to the first antenna 104. As will be described, the preferred embodiment uses the coil of the UHF oscillator 102 as the first antenna 104 rather than a separate discrete antenna. When the RF signal is applied to the first antenna 104 the signal is broadcast by electromagnetic radiation. A surface acoustic wave (SAW) resonator 100 is used to control and stabilize the frequency of operation of the UHF oscillator 102 of the transmitter 10. The resonator used in the preferred embodiment is the RP-1042 180° Quartz SAW Resonator. The resonator 100 is packaged in a standard hermetically sealed metal can which is also used to package transistors. The can is approximately ⅛ of an inch in diameter and 1/6 of an inch high.

When the user engages the activation means 103, the UHF oscillator 102 drives a first antenna 104 with a signal which is radiated. The radiated signal is received by a second antenna 106 and detected by a narrow bandwidth companion receiver 108. The bandwidth of the receiver 108 is approximately 0.1% of the center frequency of the SAW resonator 100 and can be controlled by means of lumped circuit elements as the user's hand does not surround the receiver during normal operation. The advantage of a narrow bandwidth receiver 108 is an increase in the sensitivity of the receiver which is useful in applications such as security systems, garage door openers, etc. which are limited in range by the low power restrictions of the transmitter imposed by the FCC. A further advantage is the noise reduction and spurious signal rejection inherent in narrow bandwidth operation.

Figure 2:
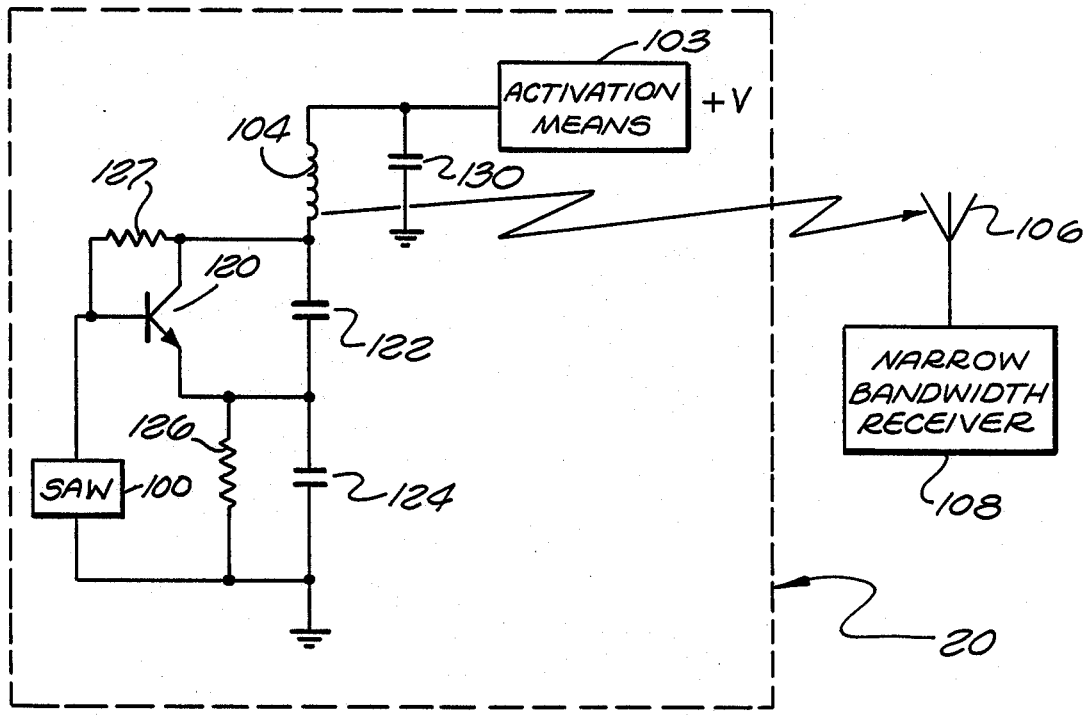
FIG. 2 illustrates a basic Colpitts transistor oscillator utilizing a resonator for frequency stabilization with a companion narrow bandwidth receiver; and, FIG. 3 illustrating an encoded Colpitts transistor oscillator frequency stabilized by a resonator and a decoding narrow bandwidth receiver.

FIG. 2 shows the application of a SAW resonator 100 to a Colpitts UHF transistor oscillator in a low power frequency stabilized transmitter system 20. A Colpitts transistor oscillator utilizes a parallel-tuned, low Q, tank circuit having two voltage dividing capacitors in series with their common connection going to the emitter of a transistor. In FIG. 2 a first series capacitor 122 is connected to the collector of the transistor 120 and to a second series capacitor 124. The common junction of the series capacitors 122 and 124 is connected to the emitter of the transistor 120. Resistor 126 provides bias to the emitter. The tuned tank circuit is completed by the coil which is used as the first antenna 104. The resistor 127 completes the circuit by providing a bias potential to the base of the transistor 120. The SAW resonator 100 provides a low impedance RF return path to the base of the transistor 120 to stabilize the Colpitts oscillator within 0.05% of the center frequency of the SAW resonator 100. The user engages the activation means 103 to apply power to the oscillator, whereby the signal radiated by the first antenna 104 may be received by the second antenna 106 and detected by the companion narrow band receiver 108.

Figure 3:
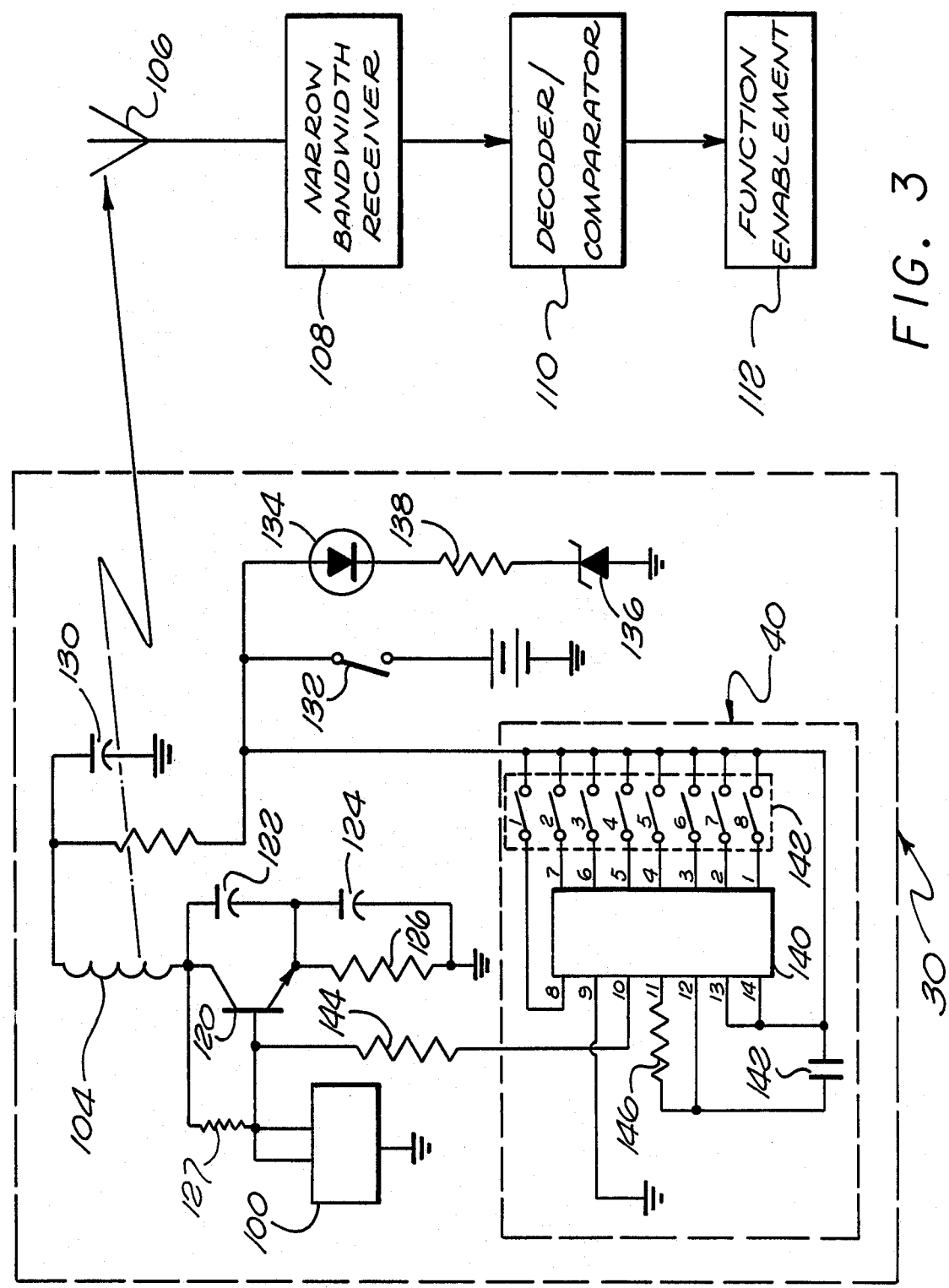

FIG. 3 shows a low power encoded transmitter 30 utilizing a surface acoustic wave resonator 100 to provide frequency stabilization for a Colpitts oscillator. The first series capacitor 122 is connected between the collector of the transistor 120 and the second series capacitor 124. The common junction of the series capacitor 122 and 124 is connected to the emitter of the transistor 120. A bias resistor 126 is also connected to the emitter. The tuned tank circuit is comprised of the series capacitors 122 and 124 in parallel with the first antenna 104 and capacitor 130. The value of the components used to construct the tuned tank circuit are selected to provide an oscillator that has a natural frequency of oscillation within 10 to 15% of the center frequency of the SAW resonator 100. The values of the first and second capacitors and the inductance of the coil can be readily calculated as:

$$f = 1/[2\pi(LC)]^{\frac{1}{2}}$$

where $$C = C_1 C_2/(C_1 + C_2)$$

The SAW resonator 100 is connected between the base of the transistor 120 and ground. The resonator will control the frequency of the oscillator to be within 0.05% of the center frequency of the resonator which in this example is 303.5 Mhz.

The RP-1042 180° Quartz SAW Resonator is constructed as a web of aluminum fingers formed on a quartz substrate. The wave excited in the SAW is the Rayleigh wave, travelling as a surface deformation which dies away very rapidly below the surface of the medium. Is has been shown that the velocity of the wave is a little lower than that of a shear wave in the medium, and that the wave is non-dispersive. Because the resonator field effect for frequency stability is on the surface of the substrate, the selection of quartz as the substrate by the manufacturer does not aid in the frequency stability as would a "quartz crystal" which depends upon transmission of a signal through a preselected thickness of quartz material for frequency stability. Therefore, the cost of the quartz is about the same as any other suitable substrate as the thickness of the substrate is not critical. However, quartz is the preferred substrate because of the dimensional stability of quartz in the presence of temperature variations.

When the activation switch 132 is closed by the user, power is supplied to the oscillator and encoding circuit 40. Feedback to the user that power is applied is provided by the activation of the light emitting diode 134.

The voltage applied to the light emitting diode is controlled by the zener diode 136 and the resistor 138.

The encoder circuit 40 used in this embodiment is comprised of an integrated circuit 140 such as the T7411-1 available from Linear Corporation (many other integrated circuits containing encoding mechanisms are available) and a DIP switch 142 arrangement, common in the art, to provide a grounded base control of the transmitter circuit through base resistor 144 to produce pulse width encoding of the transmitted signal. The state of each DIP switch is examined in sequence and a "1" or "0" is generated for the bit controlled by that switch. The clock frequency of the encoding circuit 40 is defined by the values of the clock resistor 146 and the clock capacitor 142. A datum "zero" is defined as a pulse of a first preselected width. A datum "one" is defined as a pulse width of a second preselected width detectably different from the first preselected width. FIG. 3 shows that eight bits are controlled. More bits can be controlled by the addition of more DIP switches. However, the more switches used the larger the housing must be to accommodate the additional switches and the transmitter circuit.

The encoding method of pulse width modulation (PWM) is shown in this embodiment. Some other encoding method such as pulse position modulation (PPM) may be be utilized in place of the PWM encoding.

The transmitted signal is received by the second antenna 106 and detected by the companion narrow band receiver 108. The received pulse width encoded signal is processed by the decoder/comparator 110. If the decoded signal compares to the bit positions preselected by the user, the decoder/comparator 110 enables the function enablement 112 to perform a user prespecified function such as opening a garage door, reporting a security breach, etc.

This concludes the description of a preferred embodiment of the present invention. Those skilled in the art may find many variations and adaptions falling within the scope of this invention, and the appended claims are intended to cover all such variation and adaptions falling within the true scope and spirit of the invention.

What is claimed is:

1. A miniature hand-held transmitter comprising: a housing; a fixed-frequency transmitter circuit mounted within said housing; battery means within said housing for powering said transmitter circuit; and switch means connecting said battery means to said transmitter circuit; said transmitter circuit having a tuned circuit, a transistor, and a surface acoustic wave resonator, said tuned circuit including an inductor connected to the collector of said transistor and in series with said battery means, said switch means and a first resistor, a first capacitor connected between the collector and the emitter of said transistor, a second capacitor connected between the emitter of said transistor and ground, and a third capacitor connected to said inductor and said first resistor and also connected to ground; a second resistor connected between the emitter of said transistor and ground; said surface acoustic wave resonator being connected to the base of said transistor and to ground; and an encoding circuit operatively coupled to said transmitter circuit; said transmitter circuit having a resonant frequency within a prescribed number of cycles of the frequency of resonance of said surface acoustic wave resonator, whereby the frequency of operation of said transmitter is controlled by said surface acoustic wave resonator to be within a predetermined tolerance for each of the conditions of the transmitter operating in the housing in free space or when clasped by a hand of a user when operating said switch and wherein said inductor provides the antenna of said transmitter circuit so that the antenna is disposed completely within said housing.

2. The miniature hand-held transmitter of claim 1 further including a third resistor connecting said encoding circuit to the base of said transistor.

3. The miniature hand-held transmitter of claim 2 further including a light emitter diode coupled to said switch means such that said light emitter diode is energized when said switch means is closed.

4. A miniature hand-held transmitter comprising: a housing, a fixed-frequency transmitter circuit mounted within said housing; battery means disposed within said housing for powering the transmitter circuit; and a switch means which, when operated, connects said battery to said transmitter circuit, the transmitter circuit including a transistor; a tuned circuit including: an inductor connected to the collector of said transistor and in series with said battery means, said switch means and a first resistor, a first capacitor connected between the collector and the emitter of said transistor, and a second a capacitor connected between the emitter of said transistor and means for grounding; a second resistor being connected between the emitter of said transistor and said means for grounding; a surface acoustic wave resonator connected to said the base of said transistor and to means for grounding and an encoding means operatively connected to the base of said transistor, the inductor providing the antenna of said transmitter whereby said antenna is disposed completely within said housing.

5. The miniature hand-held transmitter of Claim 4 further including a third resistor connecting said encoding means to the base of said transistor.

6. The miniature hand-held transmitter of claim 5 further including a light emitter diode coupled to said switch means such that said light emitter diode is energized when said switch means is closed.

7. The miniature hand-held transmitter of claim 4 further including a light emitter diode coupled to said switch means such that said light emitter diode is energized when said switch means is closed.

8. A miniature hand-held transmitter according to claim 7 further including a third capacitor which is coupled to the junction between said inductor and said first resistor and is further coupled to said means for grounding.

9. A miniature hand-held transmitter according to claim 4 further including a third capacitor which is coupled to the junction between said inductor and said first resistor and is further coupled to said means for grounding

* * * * *